US006842318B2

(12) United States Patent
Comeau

(10) Patent No.: US 6,842,318 B2
(45) Date of Patent: Jan. 11, 2005

(54) LOW LEAKAGE INPUT PROTECTION DEVICE AND SCHEME FOR ELECTROSTATIC DISCHARGE

(75) Inventor: Alain R. Comeau, Carlsbad, CA (US)

(73) Assignee: Microsemi Corporation, Irvine, CA (US)

(*) Notice: Subject to any disclaimer, the term of this patent is extended or adjusted under 35 U.S.C. 154(b) by 251 days.

(21) Appl. No.: 09/808,676

(22) Filed: Mar. 15, 2001

(65) Prior Publication Data

US 2002/0130364 A1 Sep. 19, 2002

(51) Int. Cl.[7] .................................................. H02H 9/04
(52) U.S. Cl. ........................................ 361/56; 361/111
(58) Field of Search ........................... 361/56, 111, 91.5

(56) References Cited

U.S. PATENT DOCUMENTS

| 4,609,931 | A | | 9/1986 | Koike | |
|---|---|---|---|---|---|
| 4,949,212 | A | | 8/1990 | Lenz et al. | |
| 5,272,586 | A | | 12/1993 | Yen | |
| 5,532,178 | A | | 7/1996 | Liaw et al. | |
| 5,696,397 | A | | 12/1997 | Sakai | |
| 5,751,507 | A | * | 5/1998 | Watt et al. | ................ 361/56 |
| 5,847,516 | A | | 12/1998 | Kishita et al. | |
| 5,852,541 | A | * | 12/1998 | Lin et al. | ................ 361/111 |
| 5,864,162 | A | | 1/1999 | Reedy et al. | |
| 5,903,419 | A | * | 5/1999 | Smith | ................ 361/56 |
| 5,959,488 | A | * | 9/1999 | Lin et al. | ................ 327/313 |
| 6,064,158 | A | | 5/2000 | Kishita et al. | |
| 6,144,542 | A | * | 11/2000 | Ker et al. | ................ 361/111 |
| 6,249,410 | B1 | * | 6/2001 | Ker et al. | ................ 361/56 |

OTHER PUBLICATIONS

A. Sedra, K.Smith. 1987, Microelectronic Circuits, Holt, Rinehart and Winston, pp. 342–343.*
Ker et al. 1996, Capacitor–Coupled ESED Protection Circuit for Deep–Submicron Low–Voltage CMOS ASIC, IEEE Trans. VLSI, v.4, No. 3, pp. 307–321.*

* cited by examiner

Primary Examiner—Brian Sircus
Assistant Examiner—Z Kitov
(74) Attorney, Agent, or Firm—Jackson Walker LLP; Robert Klinger, Esq.; Michael Cameron, Esq.

(57) ABSTRACT

ESD input protection device uses a transistor (82) with the source terminal (100) connected to the input (12) from these source (18) to provide an alternate path for discharge. By having the input (12) imprint connected to the source (100) rather than the drain (102) and the substrate (104) and gate (103) terminals connected to a reference so that a decrease in the leakage current ($I_s$) is realized as the source voltage (18) is increased over a range. The protection scheme is suitable for use with smaller device geometries such as 0.18 CMOS operating at 1½ to 2 volts.

2 Claims, 3 Drawing Sheets

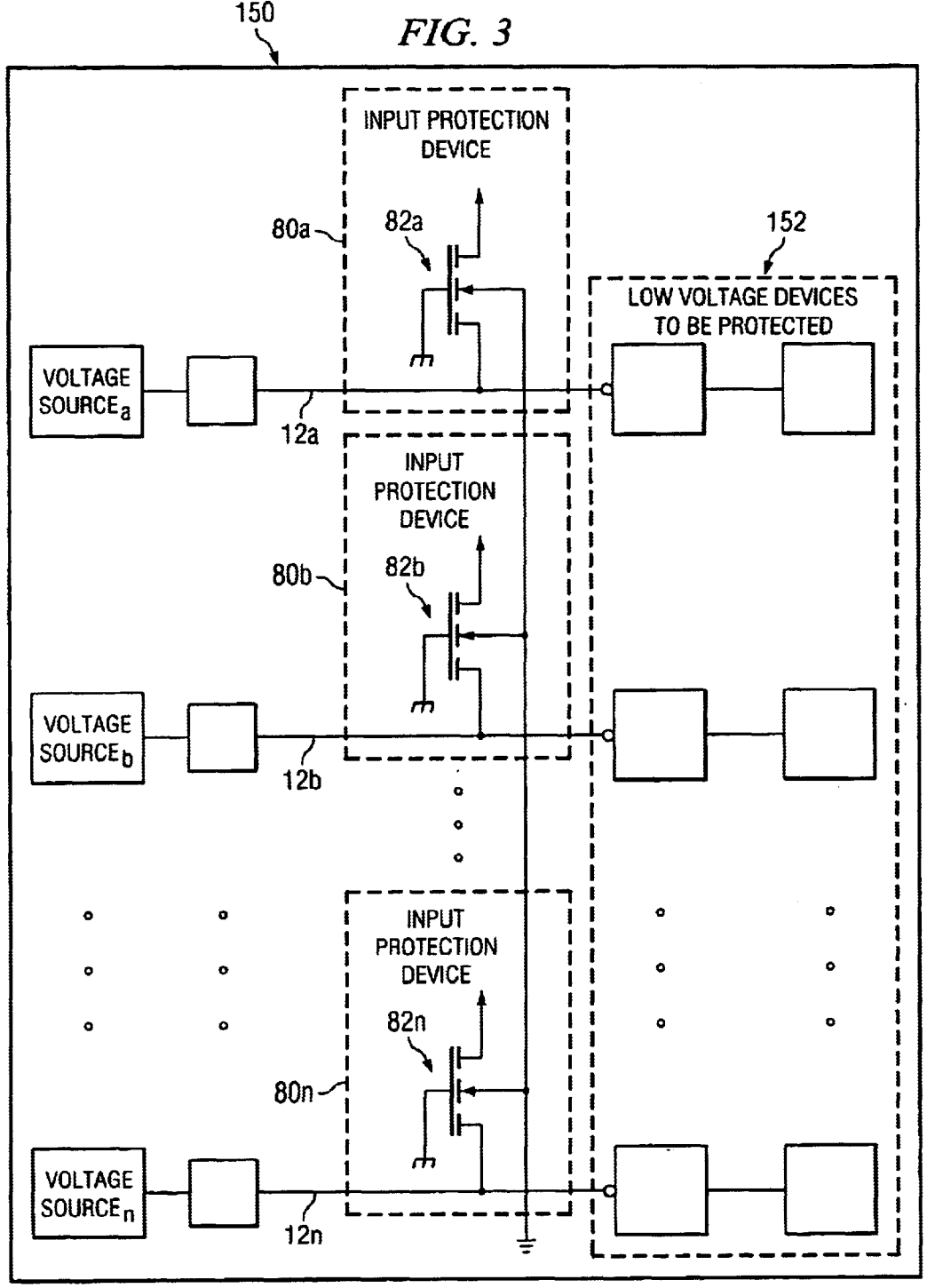

LOW LEAKAGE INPUT PROTECTION DEVICE AND SCHEME FOR ELECTROSTATIC DISCHARGE

TECHNICAL FIELD

The present invention relates in general to the protection of small scale integrated circuits and, more specifically, to a device and protection scheme suitable for use in low voltage applications having a requirement for measured leakage currents less than $10^{-13}$ A/um.

BACKGROUND OF THE INVENTION

The decrease in semiconductor device feature size and device working operating voltages has made the semiconductor device increasingly vulnerable to Electrostatic Discharge (ESD). ESD can be triggered in a semiconductor device by any unforeseen buildup of electromagnetic fields that effect current carrier distribution and existing magnetic fields in the semiconductor device. To prevent this kind of damage, an ESD protection circuit is typically included in the design of a semiconductor device.

The essential function of the ESD protection circuit is to direct transient ESD currents away from the circuits that need protection. An example of such circuits include CMOS, MOSFETs, memory circuits and other semiconductor devices and applications that are susceptible to damage from unwanted transients. Another typical application of ESD protection circuits relates to the packaging of individual dies into multi-chip module which require the use of a number of pads that interconnect the individual die into a multi-die package. Furthermore, during testing, a die is susceptible to ESD damage as the die is brought in contact with test equipment by means of contact bonds. These contact bonds are subject to introduction of ESD damage to the device under testing conditions, and the use of ESD protection circuits is required in order to avoid damage to the device.

Protection ESD circuits are typically located between input and output pads on the die. The ESD circuits provide a path of conductance from the input/output pads, the ground pad, or to a power or bias voltage path for the die. Arrangement of ESD protection circuits are commonly employed so that a single circuit is dedicated to a single input or output path in the device.

Most ESD protection schemes use two devices to provide an alternate path for transient currents that would otherwise damage the circuit to be protected. A fast device will take the sharp transient with low power while a slower device will take the bulk of the current. Normally, slow devices are of the SCR type or transistor diodes with SCR characteristics. Most of them function as a secondary snapback or provide for some type of secondary breakdown as an extension of snapback at very high power levels.

While prior art two device ESD protection configurations have proven suitable in the past, they are not well suited for a number of applications where smaller device geometries require lower operating voltages. For example, with 0.18 micron CMOS, 1½ to 2 volts are used to ensure adequate reliability. For such technologies, therefore, it is necessary to also reduce the threshold voltages of the input protection device. However, doing so with standard ESD protection components results in an increase of the leakage currents across the protection transistors which are too high for many of today's applications.

Accordingly, a need exists for a way of providing ESD input protection that reduces leakage currents in applications with low operating threshold voltages.

SUMMARY OF THE INVENTION

The present invention provides a low leakage Electrostatic Discharge (ESD) protection scheme that uses a different connection scheme to the input protection transistor to reduce input leakage currents. Essentially, the invention takes advantage of the operating characteristics of the field effect device where the voltage across the gate-to-source ($V_{gs}$) terminal is reduced as the input source voltage ($V_{source}$) is increased. Also, as the source voltage increases, the back bias into the protection transistor increases resulting in an increase in the threshold operating voltage (Vt). This results in sharply reducing leakage currents at a rate of about 1 decade per 100 mV of input signal.

Accordingly, disclosed in one embodiment is a device for ESD input protection, the device comprising a transistor with gate, source, drain, and substrate terminals. An input signal terminal is coupled to the source terminal while a reference point is coupled to the gate and substrate terminals of the transistor. A power supply terminal is coupled to the drain terminal so that current leakage is reduced to a sub-threshold level even while increasing source voltages are applied. The decreased gate to source voltage reduces the source leakage current while the increase in source to substrate voltage increases the effective gate voltage threshold further reducing leakage current on the source input. The reference point can be ground, or 0 volts, or the supply voltage for the device. Typically, the source voltage is limited to a few hundred millivolts so that the resulting measured leakage current is less than $10^{-14}$ A/um. The transistor can be NMOS or PMOS, according to various applications.

Also disclosed is a low leakage ESD protection scheme comprising a plurality of devices to be protected and a plurality of input protection transistors providing an alternate pathway for signals into the devices. Each input protection transistor includes a gate, source, drain, and substrate terminals with a plurality of input terminals operably coupled to a corresponding source terminal of an input protection transistor and to an input of a device. A reference point is coupled to corresponding gate and substrate terminals of an input protection transistor and a source voltage driving the devices and protection transistors are coupled to the source terminals of the input protection transistors. In this way, the leakage current of each input protection transistor is reduced to a below normal sub-threshold level while source voltages are increased. Furthermore, the resulting gate-to-source voltage ($V_{gs}$) is reduced while the operating threshold voltage of the transistors is increased. The reference point can be ground, 0 volts, or the supply voltage while the protection transistors can be NMOS or PMOS type, according to various applications.

Further disclosed is a low voltage Integrated Circuit (IC) with on-board ESD protection. The IC includes a plurality of low operating voltage devices which require protection from transient ESD currents. A reference terminal, a supply voltage terminal and an input terminal are coupled to the devices via a plurality of input pads. Likewise, a plurality of input protection transistors having gate, source, drain, ad substrate terminals are arranged between the input paths and the devices such that each source terminal is coupled to a corresponding input path. Each drain terminal is coupled to a device with the gate and substrate terminals coupled to a reference terminal. In this way, leakage currents of the input protection transistors is controlled to a sub-threshold level over a range of voltages applied at the source terminal of each input protection transistor. The device's terminals, input paths and protection transistors can be contained on a single die of a semiconductor chip with the ground reference being ground of the IC, zero volts, or the supply voltage level. The input protection transistors can be of NMOS or PMOS type, according to various applications.

A technical advantage of the present invention is the reduction of leakage currents in the ESD protection scheme to levels well below the sub-threshold current. Increasing the source voltage decreases the gate-to-source voltage ($V_{gs}$) and increases the threshold voltage ($V_T$) of the protection transistor. This allows ultra low input leakage while maintaining ESD protection performance.

Another advantage of the present invention is the achievement of low input current leakage while maintaining or improving latch up performance even where the input voltage is less than the supply voltage.

Still another advantage of the invention is that it allows the yield of very low leakage for NMOS transistors between approximately $V_{ss}$+200 mV and $V_{dd}$. Also, the present invention yields very low leakage for PMOS transistors between approximately $V_{dd}$–200 mV and $V_{ss}$.

Still other advantages of the present invention include compatibility with all current semiconductor device technologies, similar use of available area compared to other ESD protection techniques, and the maintenance of current ESD protection performance.

BRIEF DESCRIPTION OF THE DRAWINGS

For a better understanding of the invention including its features, advantages and specific embodiments, reference is made to the following detailed description along with accompanying drawings in which:

FIG. 3 illustrates an ESD protection scheme, according to the invention in an integrated circuit application.

References in the detailed description correspond to like references in the figures unless otherwise noted.

DETAILED DESCRIPTION OF PREFERRED EMBODIMENTS

While the making and using of various embodiments of the present invention are discussed in detail below, it should be appreciated that the present invention provides many applicable inventive concepts which can be embodied in a wide variety of specific contexts.

Figure 1A:
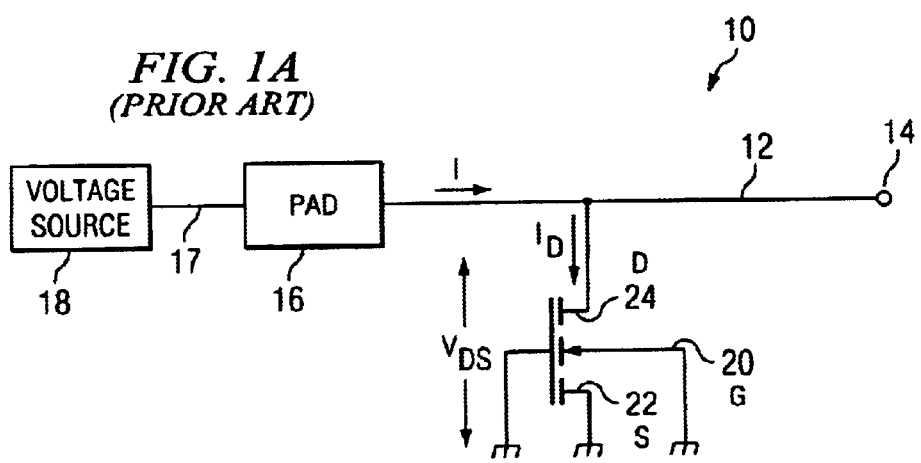
FIG. 1A illustrates a standard configuration for ESD protection, according to the prior art.

With reference now to the figures and, in particular, to FIG. 1A, therein is shown a prior art input protection device 10 for Electrostatic Discharge (ESD) applications. The input protection device 10 uses an input path 12 which provides a connection to input terminal 14 and pad 16. A voltage source 18 is applied to the input protection device 10 via pad 16 and path 17. In this way, signals from the voltage source 18 arrive at the input terminal 14 leading to a device to be protected (not shown). The device is typically any integrated circuit manufactured using one of the newer semiconductor process technologies such as Complimentary Metal Oxide Silicon (CMOS) that operate using a low operating voltage. For example, 0.18 CMOS is known to utilize 1½–2 volts. The use of such semiconductor processing technologies is well known in the art. Nevertheless, the protection of such devices using prior art protection schemes such as protection device 10 suffers from several disadvantages.

Figure 1B:
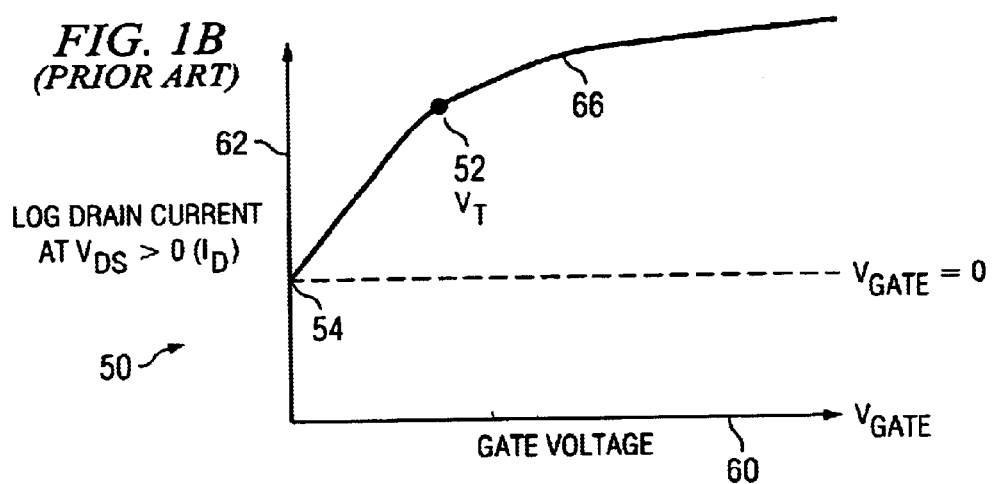
FIG. 1B shows the electrical characteristics of the standard ESD protection scheme of FIG. 1A.

The normal leakage in a transistor-type ESD protection scheme arises from the sub-threshold current. FIG. 1B illustrates how an increase in threshold voltage 52 (VT) leads to a reduction of leakage currents. The gate voltage (Vgate) applied to the device 10 is indicated across axis 60, while the log of the resulting drain current Id with a constant voltage on drain terminal is shown along vertical axis 62. As the voltage across the gate-source (Vds) is increased, the current Id through the drain terminal 24 likewise increases, as indicated by line 66. The leakage current of the transistor is indicated by point 54 when the gate-source voltage is 0V. As the gate source voltage is increased or reduced around point 54 the current varies by about a factor 10 for every 100 mV of gate-source voltage. This is true over a range of $V_{drain}$ values, resulting in a higher leakage current as Vgate increases. When a back bias (bulk-source voltage <0V) then the transistor threshold increases due to charge increase in the drain and source area. With this increase of Vt comes an effective reduction of the current at Vg=0 as curve 66 effectively shifts to the right by the amount of the Vt difference.

Figure 1C:
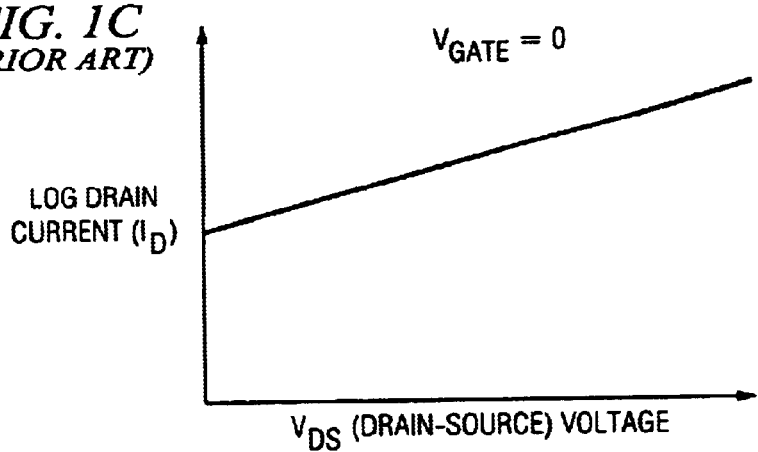
FIG. 1C illustrates the drain current logarithmically, with respect to drain-source voltage, when gate voltage is held at zero, for a standard configuration for ESD protection according to the prior art.

For applications where a low working voltage is required, the leakage current Id (point 54) can be too high. Even where Vgate is held at zero (as shown in FIG. 1C), the drain current Id nearly has a constant value from its sub-threshold current value at 54. Given the increasing use of smaller device technologies that operate at the lower threshold working voltages (Vt), there is a need to reduce the leakage current in order to provide functional yet effective ESD protection.

Figure 2A:
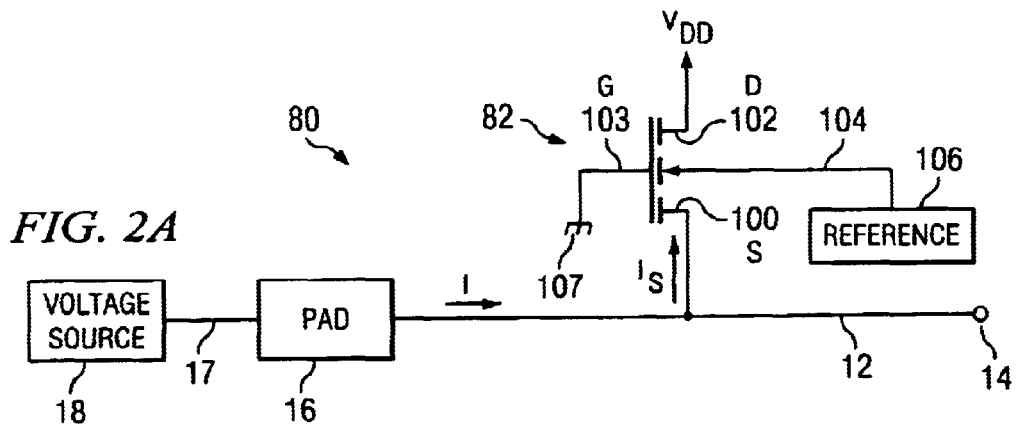
FIG. 2A illustrates a device for ESD protection, according to one embodiment of the present invention.

With reference now to FIG. 2A, therein is shown an ESD input protection device 80, according to the invention. The device 80 comprises a transistor 82, or other similar field effect device, with a source terminal 100 connected directly to input path 12 which, in turn, is connected to pad 16. The device to be protected (not shown) has an input terminal 14 which is likewise coupled to path 12. The drain terminal 102 of the transistor 82 is shown coupled to drain voltage ($V_{dd}$) while the gate 103 and substrate 104 terminals are connected to reference. In particular, substrate terminal 104 is connected to reference point 106 which may be the supply voltage ($V_{ss}$), ground, or zero volt reference of the ESD application. Thus, the input signal from the source voltage 18 is directly connected to the source terminal 100 of transistor 82. Likewise, the gate terminal 103 is connected to reference 107 which may be the identical to reference 106 (supply voltage ($V_{ss}$), ground, or zero volt reference) or just the reference of the ESD application. For purposes of clarity, Vss refers to the lowest potential supply voltage.

It has been shown that the configuration illustrated in FIG. 2A has the characteristics that an increase in source voltage 18 results in a decreased leakage current ($I_s$) through the source terminal 100. This reduced leakage current is illustrated in the chart 120 of FIG. 2B. As shown at point 122 corresponding to $V_{GS}$=0, a low leakage current $I_s$ value approximating the sub-threshold value of the device 80 is indicated. As the source voltage along axis 124 increases, a resulting decrease in the leakage current $I_s$ occurs along trace 126 and finally settles at an approximate constant current value along trace 128. Given that all values of the source current $I_s$ are lower than the sub-threshold current 122, an extremely low leakage current for a range of source voltage is obtained. Therefore, ESD protection is achieved over a range of source voltages. This allows the achievement of low input leakage currents for any source voltage 18 between the supply voltages $V_{SS}$ and $V_{DD}$ of the device 80. while maintaining ESD protection performance as well as latch up performance.

The resulting decrease in leakage current $I_s$ is related to an increase in the source voltage 18 that, in turn, reduces the gate-to-source voltage ($V_{gs}$) and has the effect of turning the transistor 82 off after a few hundred millivolts on the source voltage 18. At the same time, increasing the source voltage 18 with respect to the substrate voltage acts to increase the back bias ($V_{sb}$) on the transistor 82 which, in turn, increases its threshold voltage of ($V_t$). This relationship is captured by Equation 1:

$$V_T = V_{fb} + K * \sqrt{V_{bs} + \Phi_f} \text{ where } K = 0.5 \qquad \text{Equ. 1}$$

Therefore, reduced leakage currents for input source voltage of about a few hundred mV results. It has been shown that leakage currents on the order of $10^{-14}$ A/um can be achieved. For small device technologies (such as CMOS), a low operating working voltage is desired and a target of less than $10^{-12}$ A/um leakage current is desired. With the present invention, one achieves a $10^4$ times decrease in leakage current than is required.

The use of the protection device 80 of FIG. 2A allows low leakage for NMOS transistors between approximately $V_{ss}$+ 200 mV to $V_{dd}$. While PMOS are normally not used for ESD protection (due to poor on-resistance in snapback and secondary breakdown), the device 80 can be used to achieve low leakage for PMOS transistors between approximately $V_{ss}$ to $V_{dd}$–200 mV.

As is known in the industry, in some ESD protection schemes two (or more) devices are used per I/O: a fast device to clip the signal and a slow one to take the power. In simple implementations, the configuration shown in FIG. 2A is used as a fast ESD protection device. The device of FIG. 2A, however, may also be used as a fast device to clip a signal in combination with a slow device that absorbs the power. Moreover, the device of FIG. 2A is compatible with all current technologies and does not require the use of more area compared to prior ESD protection techniques while maintaining current ESD protection performance.

With reference now to FIG. 3, therein is shown an Integrated Circuit (IC) with on-board ESD input protection, denoted generally as 150, according to the invention. The IC 150 may be formed on a semiconductor wafer chip as a die or arrangement of die, according to well known processes. The IC 150 includes a plurality of low operating voltage devices 152 which require ESD input protection and, therefore, low leakage current. Input protection devices 80a:80n are utilized to provide alternate pathways for transient ESD currents resulting from signals supplied by $V_{source}A:V_{source}N$. Thus, an input protection device 80 is supplied for each input/output path of the IC 150.

Figure 2B:
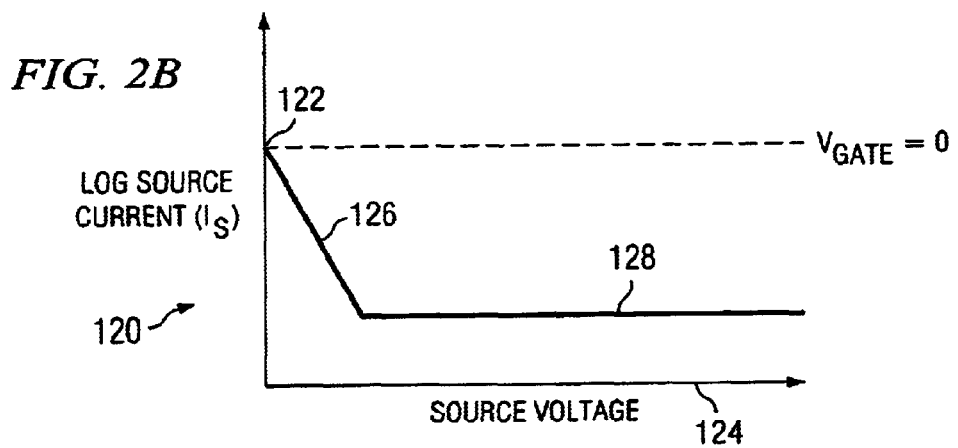
FIG. 2B illustrates the electrical characteristics of the ESD protection device of FIG. 2A.

As shown, each input protection device 80a consists of a transistor 82a:82n configured substantially as shown in FIG. 2A and adapted for operating, according to the electrical characteristics of chart 120 of FIG. 2B. Thus, the input protection transistors 82a:82n include gate, substrate, source and drain terminals such that each source terminal is coupled to a corresponding input path 12a:12n. As explained above, this arrangement of the IC 50 allows for a relatively low leakage current of the input protection transistors 82a:82n that is controlled to a sub-threshold level over a range of voltages supplied by the source voltage $V_{source}A:V_{source}N$ across each input path of the IC 150. In this way, the present invention provides an integrated circuit with onboard ESD input protection that can be used with smaller device geometries such as CMOS where there is a need for reducing the operating voltage and input leakage currents.

While the invention has been described with regard to specific and illustrative embodiments, this description and the following claims are not intended to be construed in a limiting sense. For example, some ESD protection schemes make use of 2 (or more) ESD protection devices per I/O: normally a fast one to clip the signal and a slow one to take the power. In simpler implementation only the fast device is used. The device discussed in the application is known as a fast deice. It should be understood, however, that the device of the present invention can be used with other means of ESD protection as well. As such, various modifications and combinations of the illustrative embodiments as well as other embodiments of the invention will become apparent to persons skilled in the art upon reference to the description and is intended that such variations be encompassed and included within the meaning and scope of the following claims.

What is claimed is:

1. A device for CMOS electrostatic discharge input protection comprising:

a transistor with gate, source, drain and substrate terminals;

an input signal terminal coupled to said source terminal of said transistor;

a reference point coupled to said gate and substrate terminals of said transistor;

an output signal terminal coupled to said drain terminal of said transistor where under a non-ESD bias condition the leakage current of the input protection is greatly reduced due to reverse source bias and the leakage current of said transistor is reduced to below sub-threshold level while an increasing source voltage applied at said source terminal reduces the gate-to-source voltage and increases its threshold voltage said source voltage being a few 100 mV; and wherein said leakage current is approximately $10^{-14}$ A/um of transistor width.

2. A low leakage CMOS Electrostatic Discharge (ESD) protection scheme comprising:

a plurality of low operating voltage devices, each device having at least one device input for receiving an input signal;

a plurality of input terminals for coupling an input signal to a device via a corresponding device input;

a plurality of transistors with gate, substrate, source and drain terminals, each transistor providing an alternate pathway via a source terminal for signals from said plurality of input terminals;

a reference coupled to corresponding gate and substrate terminals of said plurality of input protection transistors;

a source voltage driving both said source terminals of said input protection transistors and said inputs of said low operating voltage devices wherein under a non-ESD bias condition the leakage current of the input protection is greatly reduced due to reverse source bias and ESD protection is achieved by coupling the source terminals of said plurality of transistors to said plurality of input terminals thereby limiting the leakage current of each of said transistors to below sub-threshold level even as said source voltage increases, wherein said source voltage is limited to a few 100 mV; and wherein the resulting leakage current from said source voltage is approximately $10^{-14}$ A/um of transistor width.

* * * * *